United States Patent
Han (10) Patent No.: US 11,626,149 B2
(45) Date of Patent: Apr. 11, 2023

(54) SPI NOR MEMORY WITH OPTIMIZED READ AND PROGRAM OPERATION

(71) Applicant: Integrated Silicon Solution, (Cayman) Inc., Grand Cayman (KY)

(72) Inventor: SungJin Han, San Jose, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 87 days.

(21) Appl. No.: 17/137,321

(22) Filed: Dec. 29, 2020

(65) Prior Publication Data

US 2022/0084570 A1    Mar. 17, 2022

Related U.S. Application Data (60) Provisional application No. 63/078,832, filed on Sep. 15, 2020.

(51) Int. Cl.
| | |
|---|---|
| *G11C 7/22* | (2006.01) |
| *G11C 7/10* | (2006.01) |
| *G11C 8/18* | (2006.01) |
| *G11C 16/10* | (2006.01) |

(52) U.S. Cl.
CPC ............ *G11C 7/222* (2013.01); *G11C 7/1057* (2013.01); *G11C 7/1084* (2013.01); *G11C 8/18* (2013.01); *G11C 16/10* (2013.01)

(58) Field of Classification Search
CPC ..................................................... G11C 7/222
See application file for complete search history.

(56) References Cited

U.S. PATENT DOCUMENTS

| | | | | |
|---|---|---|---|---|
| 6,778,454 | B2* | 8/2004 | Duh | G06F 5/06 365/233.13 |
| 7,631,211 | B1* | 12/2009 | Mai | G11C 8/18 326/46 |
| 9,361,117 | B2* | 6/2016 | Behl | G11C 16/0416 |
| 10,147,481 | B2* | 12/2018 | Kim | G06F 13/1689 |
| 10,224,098 | B2* | 3/2019 | Oh | G11C 16/10 |
| 10,789,010 | B2* | 9/2020 | Vergis | G06F 13/1684 |
| 10,915,259 | B2* | 2/2021 | Kim | G06F 11/1441 |
| 11,068,179 | B2* | 7/2021 | Lee | G06F 13/1678 |
| 2009/0213659 | A1 | 8/2009 | Lee et al. | |
| 2011/0072297 | A1 | 3/2011 | Huang | |
| 2018/0061478 | A1* | 3/2018 | Vergis | G06F 13/16 |

OTHER PUBLICATIONS

EP Application No. 21194099.4, Search Report, 8 pages, dated Mar. 3, 2022.

* cited by examiner

*Primary Examiner* — Douglas King (57) ABSTRACT

A serial NOR memory device receives serial input data using a single data rate (SDR) mode and transmits serial output data using a double data rate (DDR) mode. In some embodiments, a serial NOR memory device includes an input-output circuit including a transceiver coupled to receive a clock signal and serial input data and to provide serial output data. The transceiver is configured to receive serial input data using the single data rate mode and is configured to transmit serial output data using the double data rate mode.

14 Claims, 6 Drawing Sheets

SPI NOR MEMORY WITH OPTIMIZED READ AND PROGRAM OPERATION

CROSS REFERENCE TO RELATED APPLICATIONS

This application claims priority to U.S. Provisional Patent Application No. 63/078,832, entitled SPI NOR MEMORY WITH OPTIMIZED READ AND PROGRAM OPERATION, filed Sep. 15, 2020, which is incorporated herein by reference for all purposes.

FIELD OF THE INVENTION

The invention relates to serial peripheral interface (SPI) NOR memory devices, and, in particular, to an SPI NOR memory device with optimized read and write operations.

BACKGROUND OF THE INVENTION

Serial Peripheral Interface (SPI) NOR memory devices refer to a class of serial NOR memory devices, typically NOR flash memory devices, that interfaces a host device via a serial peripheral interface (SPI) bus and follows SPI protocol. By using a serial interface, a SPI NOR flash memory device can be implemented with reduced pin count for the interface. SPI NOR memory devices are becoming popular in booting memory application where there is more frequent read operation than program operation. Conventional methods to increase the performance of the SPI NOR flash is to increase the operating frequency to increase data output bandwidth. However, the program operation is consisted of write buffer fill out and cell array write from the write buffer. Increasing the operating frequency only improves the write buffer fill out time. The majority of the program time is the cell array write time from the write buffer, so higher data input bandwidth could only slightly improve the program time of the SPI NOR flash memory.

BRIEF DESCRIPTION OF THE DRAWINGS

Various embodiments of the invention are disclosed in the following detailed description and the accompanying drawings.

DETAILED DESCRIPTION

According to embodiments of the present disclosure, a serial NOR memory device is configured to receive serial input data using a single data rate (SDR) mode and to transmit serial output data using a double data rate (DDR) mode. By using SDR mode for receiving serial input data and using DDR mode for transmitting output data, the read performance of the serial NOR memory device is improved while the write performance is maintained, that is, the write performance with using the SDR mode for data input is the same as if the DDR mode is used for write data input.

In the present description, a serial NOR memory device refers to a NOR memory device that uses a serial interface to communicate with a host device using a given serial protocol. In some embodiments, the serial NOR memory device is a SPI NOR flash memory device. A SPI NOR flash memory device is a NOR flash memory that interfaces a host device via a serial peripheral interface (SPI) bus and follows SPI protocol.

Figure 1:
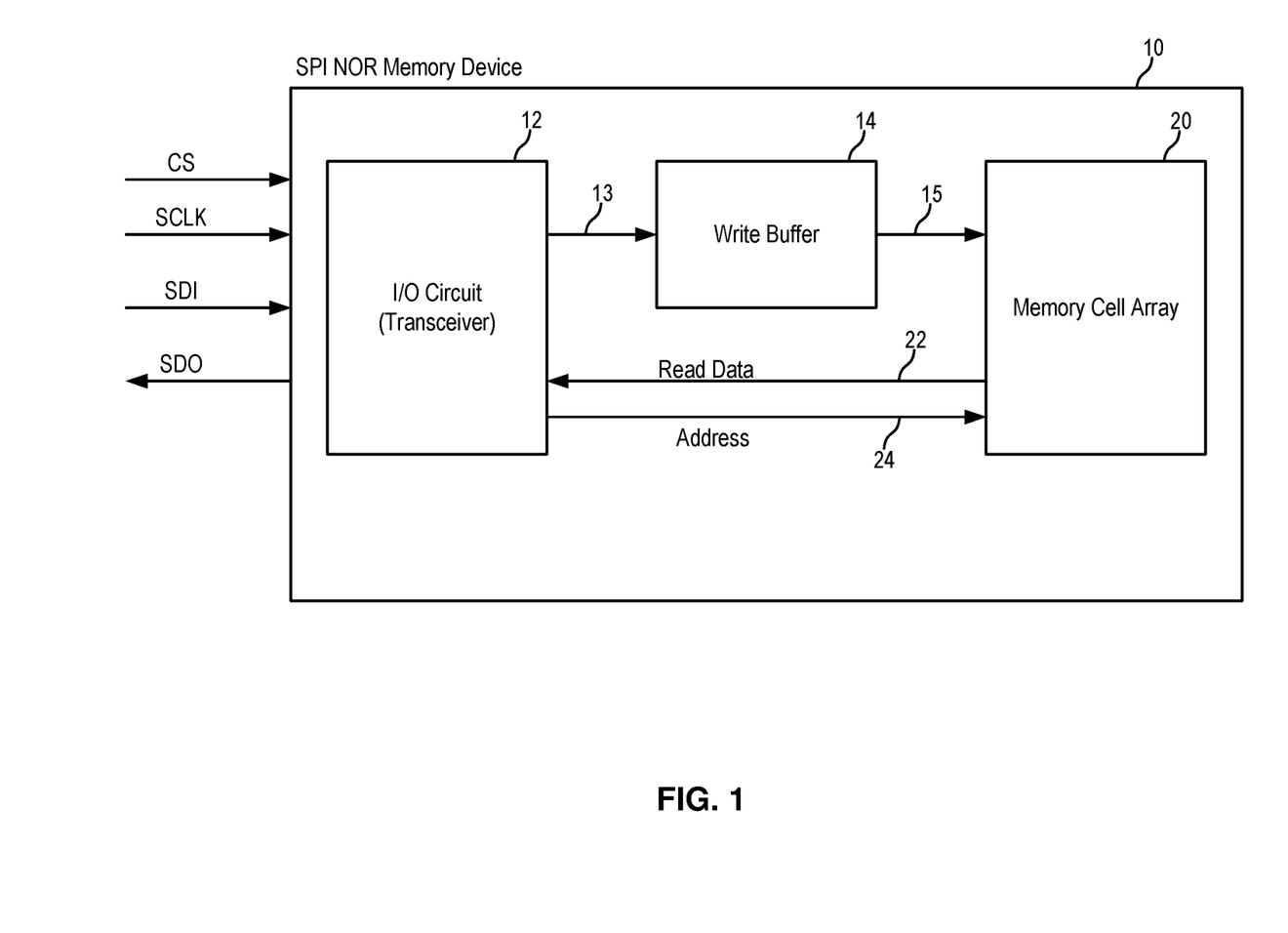
FIG. 1 illustrates a serial NOR memory device in embodiments of the present disclosure.

FIG. 1 illustrates a serial NOR memory device in embodiments of the present disclosure. Referring to FIG. 1, a serial NOR memory device 10 uses a serial data interface to communicate with a host device (not shown). In the present embodiment, the serial NOR memory device 10 is illustrated as a SPI NOR memory device implementing the SPI protocol. In the present illustration, the SPI NOR memory device 10 receives a chip select signal (CS) on a first terminal, a serial clock signal (SCLK) on a second terminal, and a serial data input (SDI) on a third terminal. The SPI NOR memory device 10 provides a serial data output (SDO) on a fourth terminal.

The SPI NOR memory device 10 includes an input-output circuit 12 which functions as the interface to receive input data to the memory device and to provide output data from the memory device. In some embodiments, the input-output circuit 12 includes a transceiver circuit and input-output buffers. The transceiver circuit includes a receiver circuit to receive incoming data and a transmitter circuit to transmit outgoing data. Under the SPI protocol, the SPI NOR memory device 10 receives the chip select signal CS to indicate the particular device is selected for access. The SPI NOR memory device 10 further receives the serial clock signal SCLK to indicate the clock rate for the input and output signals. Finally, the SPI NOR memory device 10 receives serial input data on the SDI terminal, which includes commands, addresses and write data. The commands can include a read command for reading data from the memory device and a write command for writing or programming data to the memory device. The SDI NOR memory device 10 outputs serial output data on the SDO terminal. More specifically, the serial output data is the read data retrieved from the memory array. The SDI NOR memory device 10 includes a memory cell array 20, typically including an array of storage transistors or memory cells, for storing data.

In embodiments of the present disclosure, the SPI NOR memory device 10 is a NOR flash memory device and the memory cell array 20 is an array of flash memory cells. In a flash memory device, write data is written into the flash memory cells through a program operation. The SPI NOR memory device 10 includes a write buffer 14 for storing incoming write data before the write data is programmed into the flash memory array. For example, the write buffer 14 may store one page of write data. For a read operation, read data from the memory cell array 20 is provided on a bus 22 to the input-output circuit 12. No intervening buffer is used. For both the read and write operation, the input-output circuit 12 provides the respective memory address to the memory cell array 20 on an address bus 24.

It is instructive to note that the construction of the SPI NOR memory device 10 in FIG. 1 is simplified to illustrates only elements relevant to the present disclosure. One of ordinary skill in the art would appreciate that in actual practice, the SPI NOR memory device 10 includes elements not shown or not explicitly described herein to support the operation of the SPI NOR memory device. The SPI NOR memory device 10 in FIG. 1 is illustrative only and not intended to be limiting.

Figure 2:
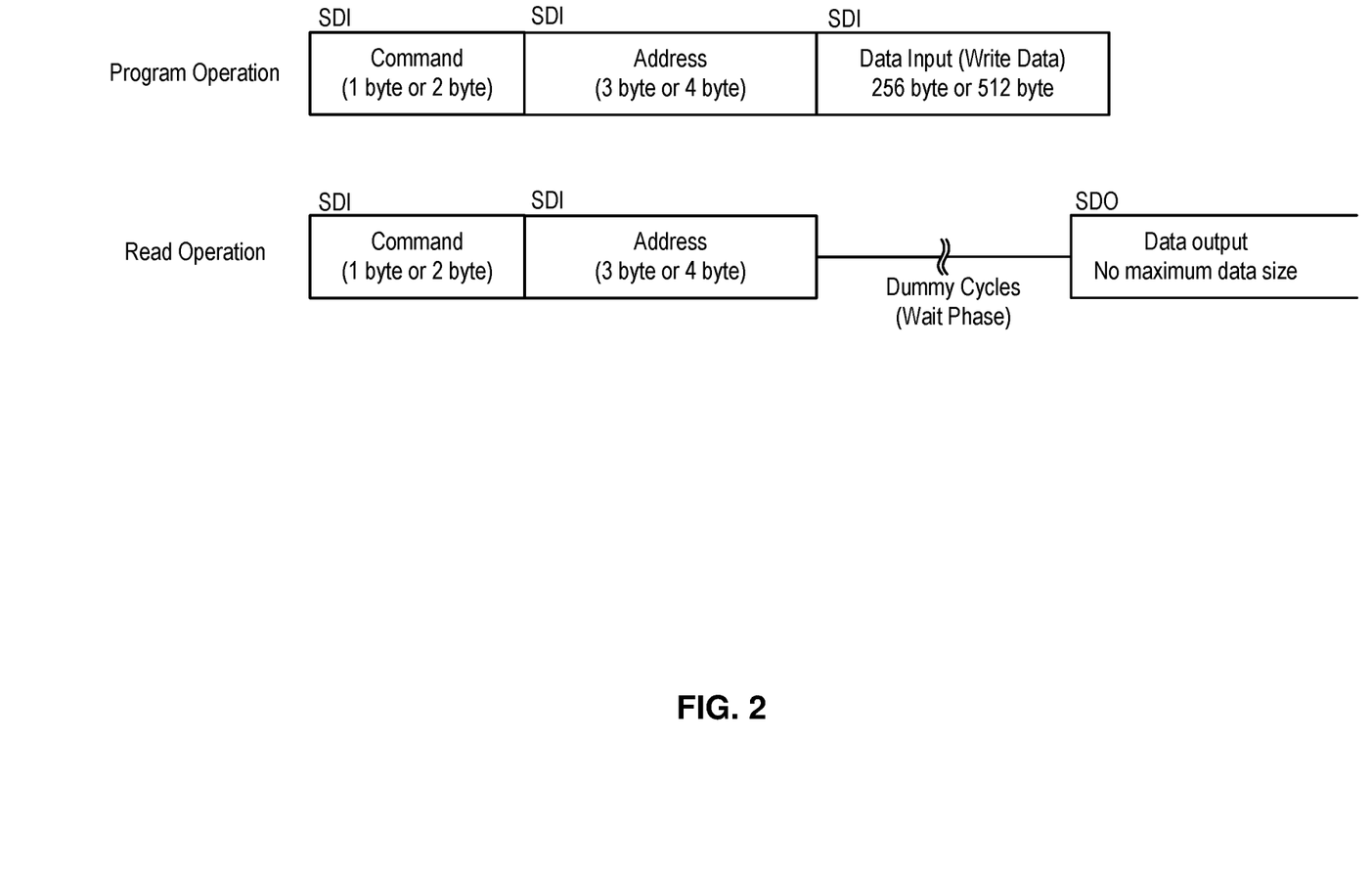
FIG. 2 illustrates the program operation and the read operation in a serial NOR memory device in embodiments of the present disclosure.

FIG. 2 illustrates the program operation and the read operation in a serial NOR memory device in embodiments of the present disclosure. Referring to FIG. 2, the program operation is used to program or write data into the memory cell array 20 (FIG. 1) of the serial NOR memory device. For the program operation, all the incoming data is provided as serial data on the serial data input (SDI) terminal. The serial NOR memory device receives a command signal, which can be 1 to 2 bytes, followed by an address signal, which can be 3-4 bytes. The command signal can include a Read command and a Write or Program command. Then, the data input or the write data is provided on the SDI terminal. The write data can be 256 bytes or 512 bytes in some examples.

For the read operation, the incoming data is provided as serial data on the serial data input (SDI) terminal. The serial NOR memory device receives the command signal (1 to 2 bytes), followed by the address signal (3-4 bytes) on the SDI terminal. Then, the serial NOR memory device goes into a wait phase while the read data is being retrieved from the memory cell array. During the wait phase, the clock cycles are considered dummy cycles. After the wait phase, the serial NOR memory device provides the data output or the read data on the serial data output (SDO) terminal. In some examples, there is no maximum data size for the read data output.

As described here, the serial NOR memory device can be a SPI NOR memory device implementing the SPI protocol. SPI is a synchronous, full duplex master-slave-based interface. The data from the master or the slave is synchronized on the rising or falling clock edge. Furthermore, in the present description, SDR and DDR refers to two common ways of clocking data in an electronic device. In single data rate (SDR), data is only clocked on one edge of the clock signal, either the rising edge or the falling edge. Therefore, the SDR mode transmits data at the same clock rate of the clock signal. In double data rate (DDR), data is transferred on both the rising and falling edge of the clock. Therefore, the DDR mode transmits data at the double the clock rate of the clock signal.

Figure 3:
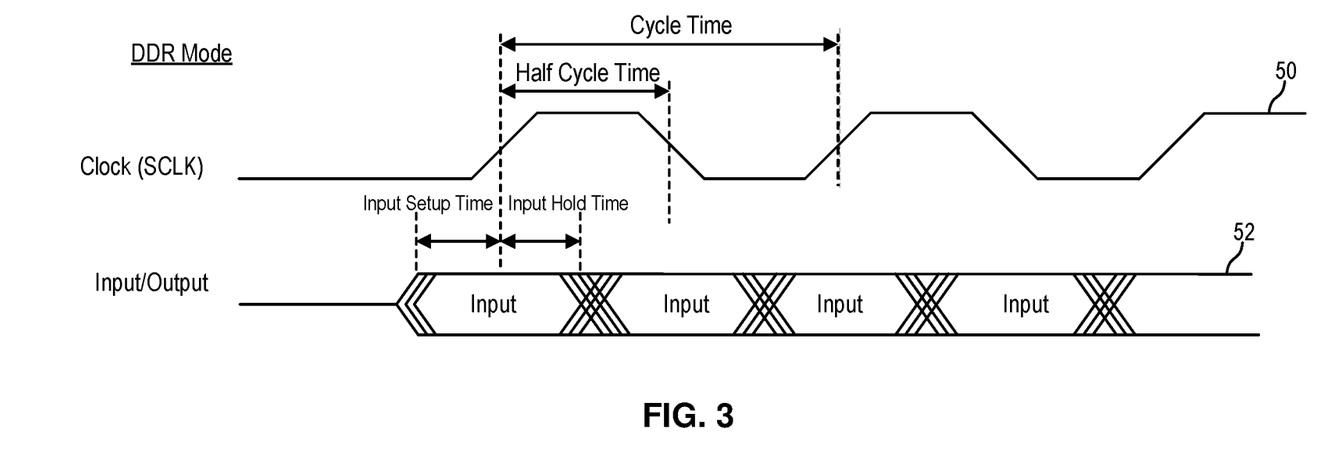
FIG. 3 is a timing diagram illustrating the DDR operation in some examples.
Figure 4:
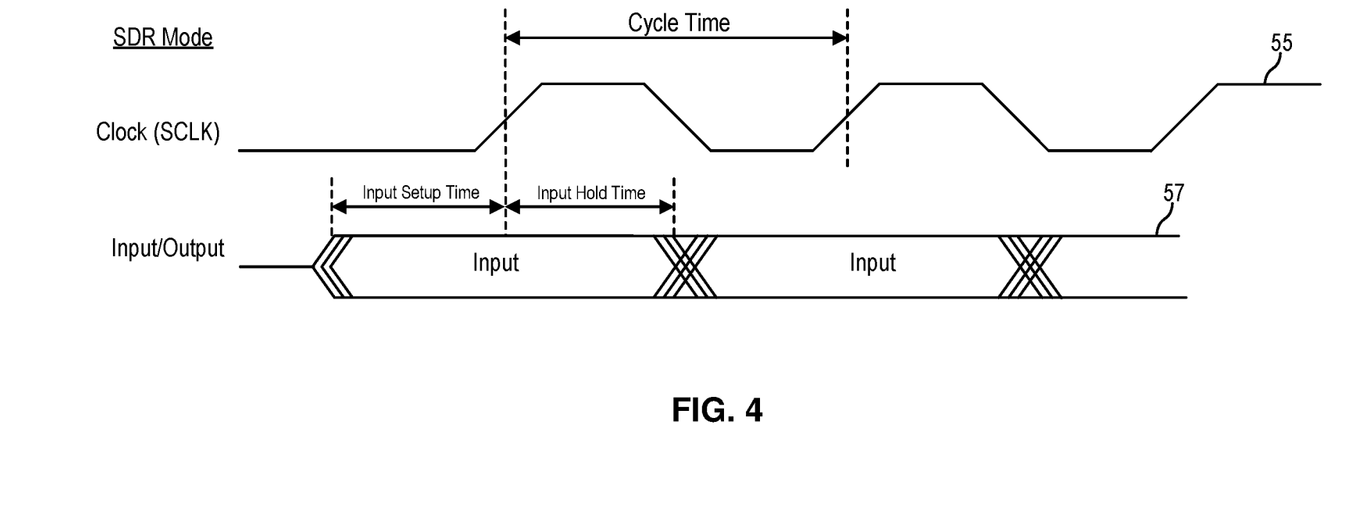
FIG. 4 is a timing diagram illustrating the SDR operation in some examples.

FIG. 3 is a timing diagram illustrating the DDR operation in some examples. FIG. 4 is a timing diagram illustrating the SDR operation in some examples. Referring first to FIG. 3, a clock signal SCLK (curve 50) is used to clock input data (curve 52) using the DDR mode. The clock signal SCLK has a cycle time defined as the time period between adjacent rising clock edges (or adjacent falling clock edges). The clock signal SCLK has a half cycle time between the rising clock edge and the following falling clock edge. The cycle time of the clock signal is referred to as the clock rate or the clock frequency. When DDR mode is used, the input data is clocked at both the rising clock edge and the falling clock edge. Therefore, the data is clocked at twice the clock rate. Referring now to FIG. 4, a clock signal SCLK (curve 55) is used to clock input data (curve 57) using the SDR mode. When SDR mode is used, the input data is clocked only at the rising clock edge (or the falling clock edge). Therefore, the data is clocked at the clock bit rate.

When a clock signal is used to clock an input data, the input data has to be provided (or be valid) for a time period referred to as an input window. The input window includes the input set-up time and the input hold time. That is, the input data has to be valid for the input set-up time before the clock edge and the input data has to be valid for the input hold time after the clock edge. As can be observed from FIGS. 3 and 4, when DDR mode is used, the input window becomes narrower as compared to the input window for the case when SDR mode is used.

To realize a high performance SPI NOR Flash, the operating frequency is often increased, which means the clock frequency is increased. As a result, the input window (the input setup time and the input hold time) would be shortened, especially when the DDR mode is used. In the SPI NOR flash memory device, the read performance is proportional to the higher operating frequency. That is, increasing the operating frequency improves the read performance. On the other hand, in the SPI NOR flash memory device, the program performance is not proportional to the higher operating frequency. That is, increasing the operating frequency does not improve the program performance in the SPI NOR flash memory device.

Returning to FIG. 1, in the SPI NOR memory device 10, the program operation includes a write buffer fill out time where the write data is written into the write buffer 14 and a program data time where the write data from the write buffer 14 is programmed into the memory cell array 20. In most cases, the write buffer size is relatively small (256 byte or 512 byte) as compared to the memory cell array 20. For example, the memory cell array may be 2K/4K/8K byte or larger. In practice, the write buffer fill out time is about several hundreds of nanoseconds, while it takes several microseconds to program data into memory cell array 20. Increasing the operating frequency will only shorten the write buffer fill out time and does not impact the program data time at all. Because the buffer fill out time is only a small fraction of the program operation (sometimes referred to as the write time), increasing the operating frequency does not improve the performance of the program operation by very much. Accordingly, there is only a small program performance difference between using the SDR data input mode and using the DDR data input mode, where the DDR data input mode mainly improves the write buffer fill out time.

In embodiments of the present invention, a high performance serial NOR memory device is configured to use the SDR mode for receiving serial input data and to use the DDR mode for transmitting serial output data. As described above, the read operation performance benefits from increasing clock frequency and therefore using DDR mode for transmitting the read data would lead to improvements in read performance. However, the program operation performance does not improve very much by the use of a faster clock frequency. Therefore, using DDR mode for receiving write data does not lead to much program performance improvements. Meanwhile, using the DDR mode increases the demand for input signal timing as the input window is reduced. Accordingly, embodiments of the present invention optimize the performances of the serial NOR memory device by using the SDR mode for receiving input data and DDR mode for transmitting output data.

Figure 5:
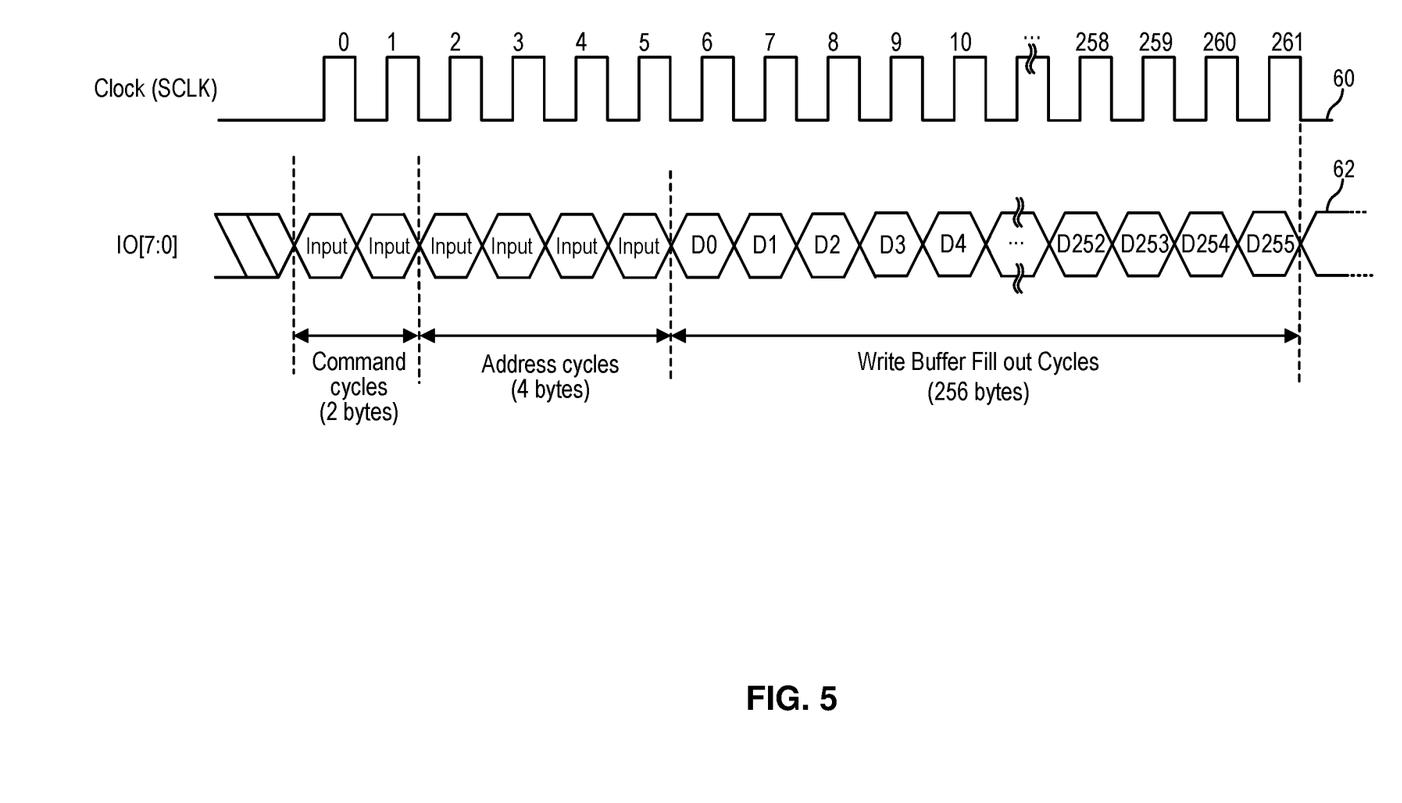
FIG. 5 is a timing diagram illustrating the buffer fill process in the program operation of a serial NOR memory device in embodiments of the present disclosure.

FIG. 5 is a timing diagram illustrating the buffer fill process in the program operation of a serial NOR memory device in embodiments of the present disclosure. Referring to FIG. 5, in the program operation, the SPI NOR memory device receives a clock signal SCLK (curve 60) and also receives a serial data input on an 8-bit serial data input bus IO[7:0] (curve 62). The timing diagram in FIG. 5 illustrates using the SDR mode for data input. In one example, the operating frequency is 400 MHz and the clock cycle time is 2.5 ns. The serial NOR memory device receives a 2-byte command and a 4-byte address on the serial data input bus. Then, the serial NOR memory device receives the write data which is provided to the fill the write buffer. In the present example, the write buffer size is 256 bytes. Therefore, the write buffer fill out cycles include 256 clock cycles used to fill the 256 bytes in the write buffer.

In some examples, the time to program one page (256 bytes) of write data in a serial NOR memory device is typically around 200 us. Accordingly, the portion of write buffer fill out time to the total program time (first time cell program case) is relatively small.

In particular, when SDR mode is used for the write data:

Write buffer fill out time=2.5$ns$×(2clock+4clock+ 128clock)=335$ns$

The total program time is the sum of the write buffer fill out time and the program data time:

Total program time($SDR$)=335$ns$+200,000$ns$=200, 335$ns$

On the other hand, when DDR mode is used for the write data:

Write buffer fill out time=2.5$ns$×(1clock+2clock+ 64clock)=167.5$ns$

The total program time for the DDR case is:

Total program time($DDR$)=167.5$ns$+200,000$ns$=200, 167.5$ns$

As seen from the above calculation, the program time difference between DDR data input transfer and SDR data input is just 0.083%.

In program operation, the write data input window (the input setup time+ the input hold time) is ⅓ of the half cycle time in DDR mode. In one example, at 400 MHz (2.5 ns cycle time), the write data input window is only about 0.4 ns, which is very difficult for the transceiver circuit in the SPI NOR flash memory device to fetch the input data correctly.

Traditional SPI NOR flash memory devices may use the SDR mode for the serial data input and the serial data output. Alternately, a mixed input configuration has been used where the command input uses the SDR mode but the address and data input and the read data output uses the DDR mode. Other schemes involving using DDR for all the serial data input and the serial data output have been proposed. Although using DDR mode and high operating frequency can improve the read performance, increasing the operating frequency for the program operation does not improve program performance that much but instead makes the program operation more difficult due to a smaller write input window.

Figure 6:
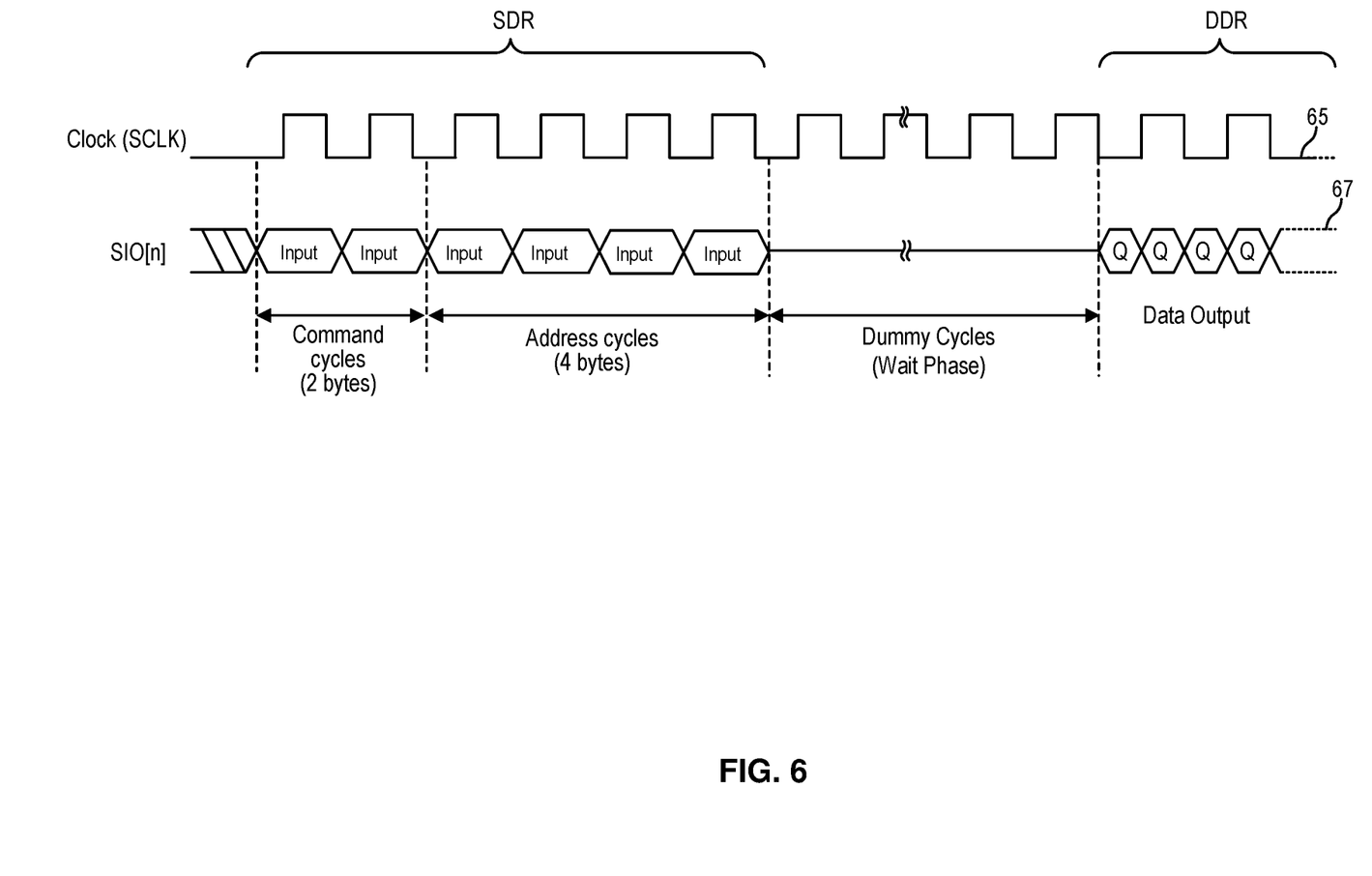
FIG. 6 illustrates the optimized SDR-DDR mode in a serial NOR memory device according to embodiments of the present disclosure.

In embodiments of the present disclosures, an SPI NOR memory device is configured to receive all serial data input using the SDR mode and transfer serial output data using the DDR mode. FIG. 6 illustrates the optimized SDR-DDR mode in a serial NOR memory device according to embodiments of the present disclosure. Referring to FIG. 6, a clock signal SCLK (curve 65) is used to clock input data and to transmit output data (curve 67). FIG. 6 illustrates the read operation being performed using the optimized SDR-DDR mode. In the read operation, the command signal (2 bytes) and the address signal (4 bytes) are clocked in using the SDR mode. In this manner, the demand on the transceiver of the serial NOR memory device to read the serial input data is lessened. After the wait phase or the dummy clock cycles, the output read data (Data Output) is provided using the DDR mode. In this manner, the read performance is improved by using a higher frequency to clock out the read data.

In the case of a write operation, all of the serial data input—command, address, write data—is clocked using the SDR mode. In this manner, the SPI NOR memory device operates more reliably where the receiver of the input-output circuit is able to reliably fetch valid serial input data including command, address, and write data in the SDR (Single Data Rate) mode. Meanwhile, the transceiver of the SPI NOR memory device is able to transmit output read data including cell data and data strobe output in the DDR (Double Data Rate) mode.

As described above, higher clock frequency read operation will directly improve read performance because read operation speed is proportional to read performance. The SPI NOR memory device of the present disclosure can improve the read performance, such as the data output bandwidth, by two or more times using the same technology by increasing the operating frequency through using the DDR mode while maintaining similar program performance through using the SDR mode. The SDR mode also lessens the demand on the input signals by providing a wider input window for the serial input data.

Figure 7:
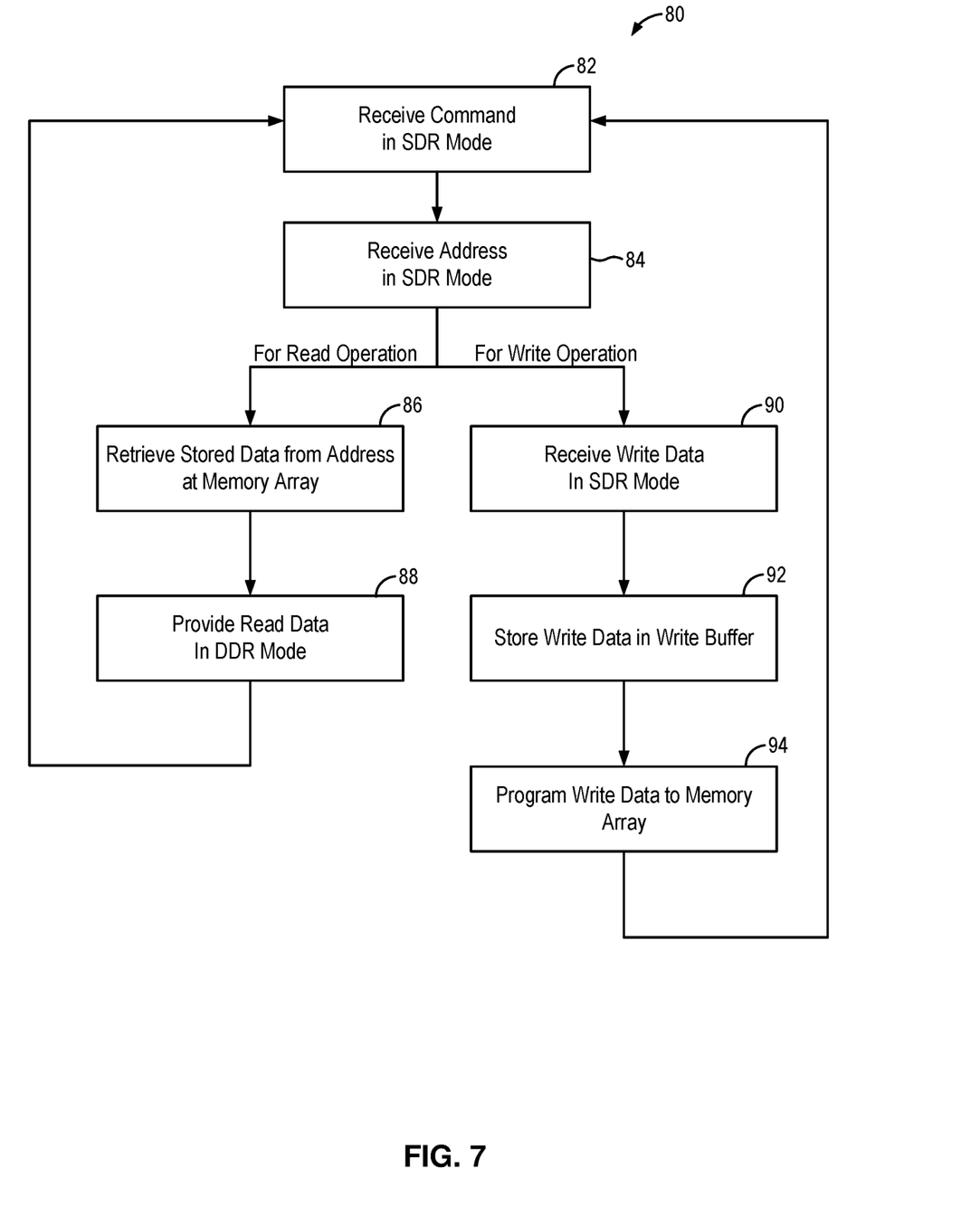
FIG. 7 is a flowchart illustrating the memory operation in the serial NOR memory device in embodiments of the present disclosure.

FIG. 7 is a flowchart illustrating the memory operation in the serial NOR memory device in embodiments of the present disclosure. Referring to FIG. 7, a memory operation method 80 is implemented in a serial NOR memory device, such as the SPI NOR memory device of FIG. 1. The method 80 starts by receiving a command in the SDR mode (82) and receiving an address in the SDR mode (84). Then, for the read operation, the method 80 retrieves the stored data from the address at the memory array (86). Then, method 80 provides the read data in the DDR mode. In this manner, read performance is improved by providing the read data in a faster clock frequency. The method 80 returns to receive the next command.

For the write operation, the method 80 receives write data in the SDR mode (90). The method 80 store the write data into a write buffer (92). The method 80 then programs the write data to the memory array (94). The method 80 returns to receive the next command.

In this detailed description, various embodiments or examples of the present invention may be implemented in numerous ways, including as a process; an apparatus; a system; and/or a composition of matter.

A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A serial NOR memory device in communication with a host device via a serial data interface, comprising:
   an input-output circuit comprising a transceiver coupled to receive a serial clock signal on a clock input terminal from the host device and serial input data on a serial data input terminal, the transceiver further coupled to transmit serial output data on a serial data output terminal, wherein the serial input data comprises at least a command signal and an address signal and an input data,
   wherein the transceiver is configured to receive serial input data on the serial data input terminal using a single data rate mode based on the serial clock signal and is configured to transmit serial output data onto the serial data output terminal using a double data rate mode based on the serial clock signal.

2. The serial NOR memory device of claim 1, further comprising:
   a write buffer coupled to receive and store write data from the input-output circuit, the input-output circuit receiving the write data as part of the serial input data; and
   a memory cell array including one or more memory cells for storing data, the memory cell array being configured to receive the write data from the write buffer and to store the write data into the one or more memory cells in the array; and the memory cell array further being configured to provide read data to the input-output circuit as the serial output data.

3. The serial NOR memory device of claim 2, wherein the serial NOR memory device comprises a serial NOR flash memory device and the memory cell array comprises flash memory cells, the memory cell array storing the write data from the write buffer by programming the flash memory cells in response to the write data.

4. The serial NOR memory device of claim 2, wherein in response to a given number of bytes of write data being stored in the write buffer, the serial NOR memory device stores the write data from the write buffer into the memory cell array.

5. The serial NOR memory device of claim 1, wherein the serial input data further comprises write data to be stored in the memory device.

6. The serial NOR memory device of claim 5, wherein the transceiver is configured to receive the command signal, the address signal and the write data using the single data rate mode and to transmit a read data onto the serial data output terminal using a double data rate mode.

7. The serial NOR memory device of claim 1, wherein the transceiver is configured to receive serial input data using the single data rate mode where the serial input data is clocked at a rising or falling clock edge of the clock signal; and wherein the transceiver is configured to transmit serial output data using the double data rate mode where the serial output data is clocked at both the rising and the falling edges of the clock signal.

8. A method in a serial NOR memory device in communication with a host device via a serial data interface and comprising a memory cell array, the method comprising:
   receiving a serial clock signal;
   receiving a command signal in a single data rate mode based on the serial clock signal;
   receiving an address signal in the single data rate mode based on the serial clock signal;
   in response to the command signal being a read command, retrieving read data from the memory cell array in response to the address signal; and
   transmitting the read data in a double data rate mode based on the serial clock signal.

9. The method of claim 8, further comprising:
   receiving a write data in the single data rate mode;
   in response to the command signal being a write command, storing the write data in a write buffer; and
   programming the write data from the write buffer into the memory cell array.

10. The method of claim 9, wherein receiving a write data in the single data rate mode comprises:
    receiving the write data by clocking at the rising or falling clock edge of the clock signal.

11. The method of claim 9, further comprising:
    in response to a given number of bytes of write data being stored in the write buffer, programming the write data from the write buffer into the memory cell array.

12. The method of claim 8, wherein the serial NOR memory device comprises a serial NOR flash memory device and the memory cell array comprises flash memory cells.

13. The method of claim 8, wherein receiving the command signal and the address signal in the single data rate mode comprises:
    receiving the command signal and the address signal by clocking at a rising or falling clock edge of the clock signal.

14. The method of claim 13, wherein transmitting the read data in a double data rate mode comprises:
    transmitting the read data by clocking at both the rising and the falling edges of the clock signal.

* * * * *